United States Patent

Habuka

[11] Patent Number: 5,858,881
[45] Date of Patent: Jan. 12, 1999

[54] METHOD OF PRODUCING THIN FILM

[75] Inventor: Hitoshi Habuka, Maebashi, Japan

[73] Assignee: Shin-Etsu Handotai Co., Ltd., Tokyo, Japan

[21] Appl. No.: 729,367

[22] Filed: Oct. 17, 1996

[30] Foreign Application Priority Data

Oct. 27, 1995 [JP] Japan .................................. 7-280891

[51] Int. Cl.[6] .................................................. H01L 21/00
[52] U.S. Cl. ........................... 438/758; 438/694; 438/906
[58] Field of Search ........................ 216/37, 64; 438/694, 438/758, 906

[56] References Cited

U.S. PATENT DOCUMENTS

| | | | |
|---|---|---|---|
| 4,842,897 | 6/1989 | Takeuchi et al. | 427/255.2 |
| 4,985,114 | 1/1991 | Okudaira et al. | 156/643 |
| 5,294,262 | 3/1994 | Nishimura | 134/22.1 |
| 5,443,686 | 8/1995 | Jones et al. | 216/37 |

FOREIGN PATENT DOCUMENTS

| | | |
|---|---|---|
| 0582444 | 2/1994 | European Pat. Off. . |
| 64-17857 | 1/1989 | Japan . |

Primary Examiner—Yogendra N. Gupta
Attorney, Agent, or Firm—Oliff & Berridge, PLC

[57] ABSTRACT

A method of producing a high-purity and high-quality thin film, wherein chlorine trifluoride is used as a cleaning gas for the purpose of lowering temperature at which a cleaning operation is conducted, the cleaning operation is conducted at a temperature in the range of from room temperature to 500° C., a member whose surface is made of silicon carbide is used and a combined content of free silicon and free carbon in the surface region of the member is in the range of 2 wt % or less so that corrosion of the member is prevented.

6 Claims, 2 Drawing Sheets

METHOD OF PRODUCING THIN FILM

BACKGROUND OF THE INVENTION

1. Field of the Invention

The present invention relates to a method of producing a thin film grown on a semiconductor substrate.

2. Related Art

For example, in a case where a silicon raw material gas is fed in a reaction vessel of a thin film growth apparatus for the purpose of growing a silicon single crystal thin film on a silicon single crystal substrate, silicon is deposited unintentionally on the surface exposed to the atmosphere in the vessel, such as an inner wall of the vessel, a holder for holding a silicon single crystal substrate, a gas nozzle, and the other jigs as well as on a main surface of the substrate.

Part of deposit having the shapes of a particulate or a flake formed in the reaction vessel is frequently peeled during the growth of a thin film and some of the peeled debris comes to attach on a semiconductor substrate. The debris on the substrate causes anomalous part in the thin film, such as stacking faults or protruding defects. A cleaning operation, therefore, has been required regularly to remove the deposit in the vessel.

As a function for eliminating the deposit, an aqueous solution of a strong acid or a strong base has been used to eliminate the deposit in the reaction vessel of a thin film growth apparatus through the etching action. In the case of silicon as the deposit, for example, a strong acid such as an aqueous mixture solution of hydrofluoric acid and nitric acid is used. Such an etching method by using the aqueous solution requires an operation for dismantling a reaction vessel, a holder for a substrate, a gas nozzle and the other jigs from the thin film growth apparatus to clean them, since the method is carried out in a wet condition. The wet etching method cannot be frequently applied for eliminating the deposit in the reaction vessel, since it consumes much time in such operations as dismantling, assembling, and restarting up the apparatus after adjusting the operative condition.

Another method for elimination of the deposit in the reaction vessel widely known is to introduce hydrogen chloride gas into the reaction vessel kept at a temperature near 1200° C. in order to etching off the deposit after unloading a semiconductor substrate on which a thin film has been grown.

In the case where hydrogen chloride gas is introduced into the reaction vessel at such a high temperature, however, members in the vessel suffers from damages and the reaction area is contaminated by metals carried on the hydrogen chloride gas stream.

When a thin film growth apparatus of cold-wall type is used, there are also problems that various kinds of contaminants present in non-heated regions, such as the wall, of relatively low temperature in the reaction vessel, are difficult to be removed by the use of hydrogen chloride gas, and contaminants once etched off at high temperature regions come to be again deposited on the non-heated regions and mixed into growing thin films by revaporization, which will result in crystal quality degradation of the thin film.

In light of the above-mentioned problems in the conventional methods, new cleaning gases were proposed. In this case, gases of high reactivity are used at low temperature to clean the interior of the reaction vessel of the thin film growth apparatus, wherein a gas including at least one of the group consisting of ClF, $ClF_3$, and $ClF_5$ is used to eliminate deposit in the thin film growth apparatus, said deposit being a metal or compounds thereof (see published Japanese patent No. Sho 64-17857).

When a cleaning gas, $ClF_3$ (chlorine trifluoride) is used for cleaning the interior of the reaction vessel containing a substrate holder made of graphite coated with SiC (silicon carbide), however, there happens a problem that the surface of the substrate holder is corroded by chlorine trifluoride, and in succession, the graphite in the holder is vigorously attacked and corroded to generate particulate. Consequently, the method for cleaning the interior of a reaction vessel by the use of $ClF_3$ has not been put into practical use.

Silicon carbide has been used was black in color and non-transparent even though it is obtained as a simple substance in the market. It means imbalanced stoichiometry in composition between carbon and silicon, thus either silicon or carbon is partly segregated in the solid not being sited at the lattice. It is believed by the inventors that the segregated silicon or carbon is preferably attacked by chlorine trifluoride used as a cleaning gas.

SUMMARY OF THE INVENTION

The present invention has an object, in view of the faults of the related art, to provide a method of producing a thin film, wherein, while chlorine trifluoride is used as a cleaning gas for the purpose of lowering temperature of a cleaning process, corrosion of members whose surfaces are formed of silicon carbide is suppressed to prevent generation of particulate thereby a high-purity and high-quality thin film is grown.

The present invention was made to solve the above faults of the related art and is directed to a method of producing a thin film, wherein a reaction vessel contains members whose surfaces are formed of silicon carbide with a combined content of free silicon and free carbon being 2 wt % or less in composition, and chlorine fluoride is introduced into the reaction vessel at a DESCRIPTION temperature between room temperature and 500° C. to etch off deposit on the members formed during growth of a thin film on a semiconductor substrate.

A combined content of free silicon and free carbon is required to be 2 wt % or less, or preferably 1 wt % or less in composition. Pure silicon carbide, which means that a combined content of free silicon and free carbon is 0 wt %, is most preferably used. The effect of the present invention cannot be amply achieved when a combined content of free silicon and free carbon becomes more than 2 wt %.

The above-mentioned chlorine fluoride gas is preferably a gas containing chlorine trifluoride at 0.01 vol % to 10 vol %, more preferably at 0.01 vol % to 5 vol %.

An example of the members whose surface is formed of silicon carbide as mentioned above is a substrate holder. The substrate holder has a structure of graphite and the like coated with silicon carbide or of a solid silicon carbide, any of which is suitable for the method of the present invention.

Silicon carbide has been used is black in color and non-transparent, though it is a simple substance. However, silicon carbide of a simple substance produced through a vapor phase thermal decomposition method satisfies a condition of chemical stoichiometry with high-purity and intrinsically transparent nature. A thin plate of about 1 mm thick shows halfway transparent and of light yellow in color. Silicon carbide which satisfies the condition of chemical stoichiometry means that it is constituted with silicon and carbon of the same atomic ratio as that of the chemical formula.

Experiments were made about corrosion of silicon carbide of the stoichiometric composition with an expectation that the silicon carbide is almost non-corrosive against chlorine trifluoride as a cleaning gas. Even a trace of corrosion was not observed on the surface of the silicon carbide.

By application of a method of producing a silicon single crystal thin film of the present invention, the interior of the reaction vessel of a thin film growth apparatus can be cleaned at low temperature, generation of particulate is prevented due to suppression of corrosion of silicon carbide at the surface of a substrate holder, and therefore, cleaning of the interior of the reaction vessel which contains a substrate holder whose surface is made of silicon carbide, becomes possible in a condition that crystal quality of a thin film is not adversely affected.

BRIEF DESCRIPTION OF THE DRAWINGS

Many other features, advantages and additional objects of the present invention will become manifest to those versed in the art upon making reference to the detailed description which follows and the accompanying sheet of drawings.

DETAILED DESCRIPTION OF THE INVENTION

An example of the thin film growth apparatus suitably employed in embodying a method of the present invention will be described below with reference to FIG. 1 of the accompanying drawings.

Figure 1:
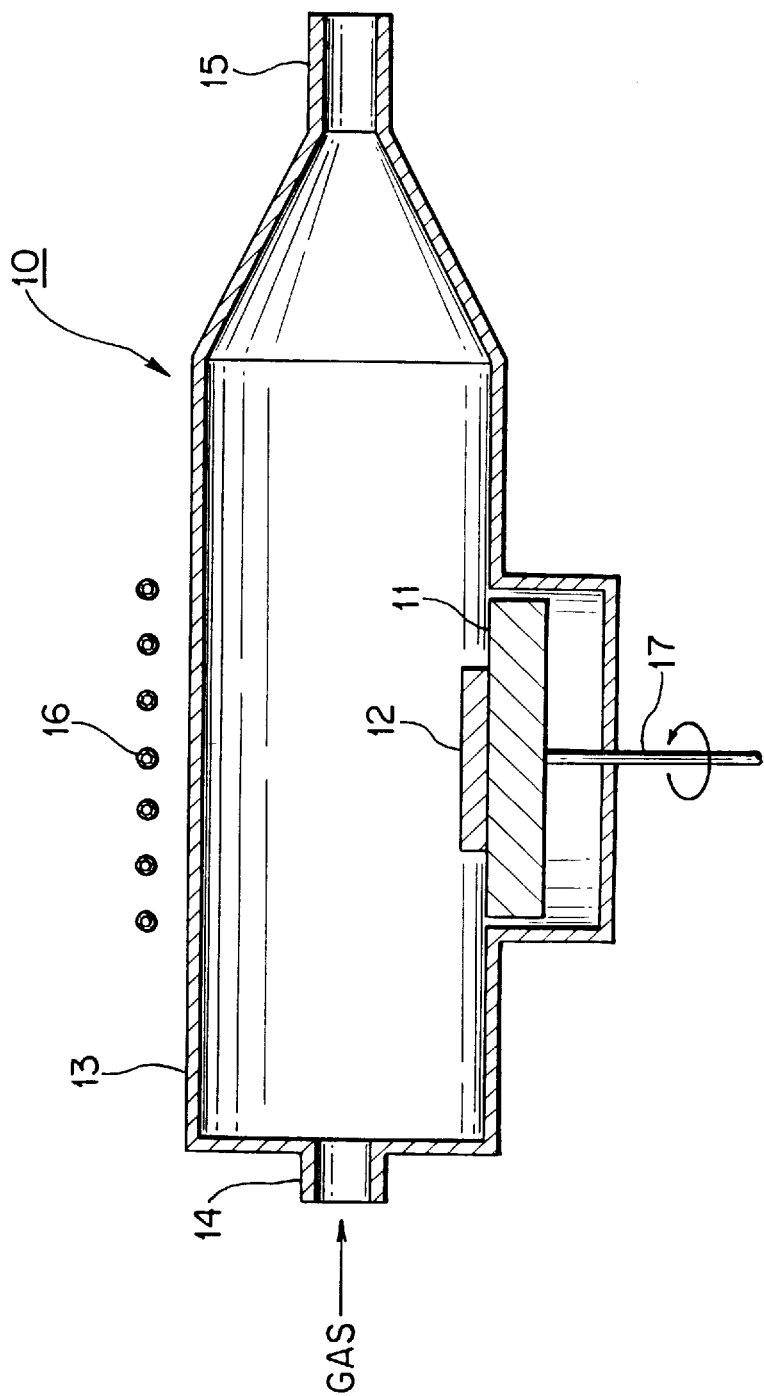
FIG. 1 is a schematic cross sectional view illustrating an example of the thin film growth apparatus employed in an embodiment of the method of producing a thin film according to the present invention.

FIG. 1 is a schematic cross sectional view illustrating an example of the thin film growth apparatus 10 employed for a vapor phase growth of a thin film on a semiconductor substrate 12, for example, silicon single crystal substrate. The thin film growth apparatus 10 is equipped with radiation heating lamps 16 outside a reaction vessel 13 which is constructed with transparent quartz glass and the interior is heated by radiation through a transparent wall of the reaction vessel 13. A substrate holder 11 is placed in a heated area in the reaction vessel 13 and a silicon single crystal 12 is held on the substrate holder 11. The other reference numerals used in FIG. 1 are as follows: 14 indicates a gas inlet port located on the side of gas introduction of the reaction vessel 13, 15 indicates an exhaust port located on the side of gas exhaust of the reaction vessel 13, 17 indicates a rotary shaft mounted on the under surface of the substrate holder 11, and the substrate holder 11 rotates by way of the rotary shaft 17.

Example of the present invention which are executed using the thin film growth apparatus above mentioned will be described below.

EXAMPLE 1

Figure 2:
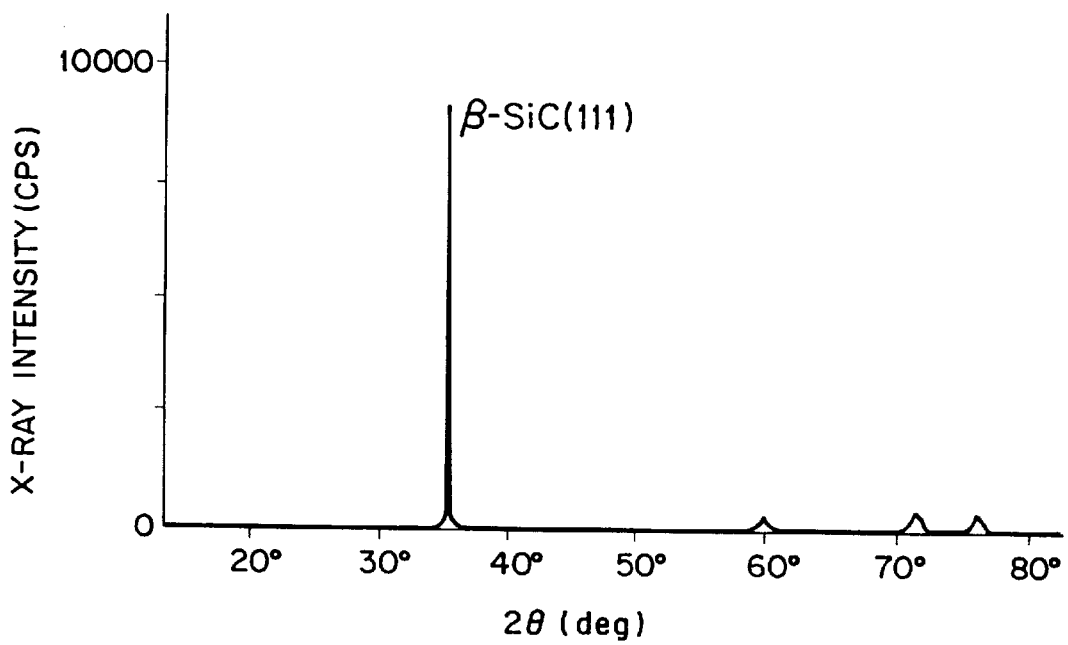
FIG. 2 is a graph showing an X-ray diffraction pattern of a substrate holder used in Example 1.
Figure 3:
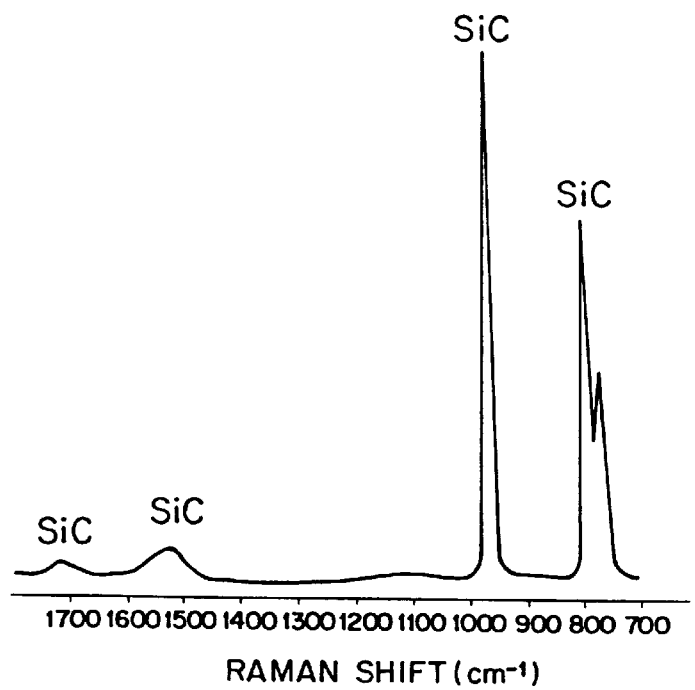
FIG. 3 is a graph showing a Raman scattering spectrum of the substrate holder used in Example 1.

A substrate holder 11 used in this example is made of solid silicon carbide produced by means of a vapor phase thermal decomposition method and has a shape of a disk 170 mm in outer diameter and 1 mm thick. The substrate holder 11 is of light yellow color and halfway transparent. It was confirmed by a X-ray diffraction pattern as a function of Bragg's angle (FIG. 2) that no diffraction peak other than those of silicon carbide is observed and therefore no free silicon is included. At the same time it was also confirmed by Raman scattering spectrum as a function of a shift in frequency of the scattered light (FIG. 3) that no Raman spectral peak other than those of silicon carbide is observed and therefore no free carbon is present in the silicon carbide. The density of the silicon carbide was 3.21 g/cm$^3$.

A p-type silicon single crystal substrate 12 of a main surface of (100) orientation and a diameter of 150 mm was placed on a substrate holder 11 inserted in the reaction vessel 13 of the thin film growth apparatus 10 shown in FIG. 1. The substrate holder 11 is rotated around the rotary shaft 17 when the silicon single crystal substrate 12 is placed on the holder 11 till a vapor phase growth operation is completed.

Next, while hydrogen gas was fed through the gas inlet port 14 into the reaction vessel 13, the radiation heating lamps 16 was lighted and the silicon single crystal substrate 12 was heated up. After temperature of the substrate 12 was raised to 1100° C., trichlorosilane gas was fed through the gas inlet port 14 at a feed rate of 13 g/min together with a trace portion of a dopant gas for 1 min to grow a silicon single crystal thin film in vapor phase. The reaction gas went out through the exhaust port 15.

After the completion of vapor phase growth and cooling of the interior of the reaction vessel 13, an atmospheric gas was switched to nitrogen gas from hydrogen gas and in succesion the silicon single crystal substrate 12 was taken out. A silicon single crystal thin film of about 4 $\mu$m thick was grown on the silicon single crystal substrate 12 in vapor phase.

Since about 10 mm wide peripheral area of the substrate holder 11 was not covered by the silicon single crystal substrate 12, the area was contacted with trichlrosilane gas to deposit silicon. The thickness of the silicon deposited on the substrate holder 11 was measured after the substrate holder 11 is taken out, and the result was about 4 $\mu$m same as that of the thin film on the substrate 12.

The substrate holder 11 was turned back in the reaction vessel 13 and the substrate holder 11 was heated in nitrogen atmosphere with the radiation heating lamps 16 at a low power to maintain the reading of a thermocouple at 300° C. which was installed under the side of the substrate holder 11. After the temperature was stabilized, a cleaning gas containing chlorine trifluoride at a concentration of 1 vol % was fed into the reaction vessel 13 for a time period of 5 min.

A concentration of chlorine fluoride in the cleaning gas is preferably in the range of 0.01 vol % to 10 vol %. In the case of a concentration of less than 0.01 vol %, deposited silicon on the surface of the substrate holder 11 cannot be amply removed by etching. On the other hand, in the case of more than 10 vol %, there happens a problem that chlorine fluoride in the cleaning gas corrodes the surface of metallic components such as SUS and the like exposed to the atmosphere in the reaction vessel 13. A concentration of chlorine trifluoride is more preferably set in the range of 0.01 vol % to 5 vol % in cleaning operation.

After the feeding of chlorine trifluoride into the reaction vessel 13, silicon deposited on the substrate holder 11 was completely etched off and only the surface of light yellow is observed on the substrate holder 11. No damage was recognized on the surface of the substrate holder 11 with the naked eye. Even with an optical microscope at 1000 magnifications, no recognizable difference in observation on the refreshed surface of the substrate holder 11 was detected compared with the surface conditions before the thin film growth or before the removal of the silicon deposit. No generation of particulate was observed either that is caused by degradation of the surface of the substrate holder 11.

EXAMPLE 2

Under the same conditions as those of Example 1, but with a substrate holder 11 made of solid silicon carbide having a different combined content of free silicon and free carbon, experiments were conducted. The color of silicon carbide is of light yellow for the stoichiometric composition, but colors change darker as a combined content of free silicon and free carbon grows larger. Each content of free silicon and free carbon was evaluated by the use of an X-ray diffraction pattern and a Raman scattering spectrum.

The results of the experiments showed that no damage was recognized on the surface of the substrate holder 11, in the case where a combined content of free silicon and free carbon was 2 wt % or less. When the combined content was increased beyond 2 wt %, however, traces of corrosion were found by means of an optical microscope at 1000 magnifications. It is desirable that in actual production, a substrate holder 11 is treated with chlorine trifluoride several 1000 times before it is replaced by another substrate holder. A combined content of free silicon and free carbon is preferably selected in the range of 1 wt % or less for such a long duration of usage.

EXAMPLE 3

Under the same conditions as those of Example 1, but with a substrate holder 11 made of solid silicon carbide having a combined content of free silicon and free carbon of about 1 wt %, and with different temperatures at which chlorine fluoride is fed into the reaction vessel 13, a series of experiments were conducted to observe changes in the surface condition of the substrate holder 11.

In the cases when the temperatures were in the range of from room temperature up to 500° C., no generation of particulate which would be caused by degradation of the surface condition was observed, though the time periods required for complete elimination of the silicon deposit were varied. The surface of the substrate holder 11 was a little altered after the repeated usage at higher temperatures in many times and for a long duration, but no defect such as protruding defects was generated on the surface when a silicon single crystal thin film was produced.

EXAMPLE 4

A substrate holder 11 which was prepared by coating the surface of a carbon body with a silicon carbide, wherein silicon carbide was produced in the same way as those in Examples 1 to 3, was used to conduct experiments similar to those of Examples 1 to 3 and the results were similar to those obtained with the substrate holders 11 made of solid silicon carbide.

In the above examples, cases where silicon single crystal thin films were grown on silicon single crystal substrates 12, are described, but the method of the present invention is applicable to another case where a thin film is grown on a single crystal substrate made of another semiconductor material.

As described above, application of a method of the present invention makes it possible to grow a high-purity and high-quality thin film by preventing generation of particulate which is realized by suppressing corrosion of members whose surfaces are made of silicon carbide as a conspicuous effect of the present invention, wherein said method uses chlorine trifluoride as a cleaning gas at a temperature in the range of from room temperature to 500° C. and chlorine trifluoride is adopted for the purpose of lowering temperature at which a cleaning process is conducted.

We claim:

1. A method of producing a thin film in a reaction vessel containing a member whose surface is formed of silicon carbide, including an etching process by feeding a gas containing chlorine fluoride into the reaction vessel to etch off a deposit formed on an exposed surface of the member during growth of a first deposited film on a first semiconductor substrate, and a deposition process to produce the thin film on a second semiconductor substrate after the etching process, wherein the silicon carbide has a combined content of free silicon and free carbon being 2 wt % or less in composition, and the gas containing chlorine fluoride is fed into the reaction vessel at a temperature between room temperature and 500° C.

2. A method of producing a thin film as claimed in claim 1, wherein the gas contains chlorine trifluoride as the chlorine fluoride at a concentration in the range of 0.01 vol % to 10 vol %.

3. A method of producing a thin film as claimed in claim 1, wherein the member whose surface is made of silicon carbide is a holder for a substrate.

4. A method of producing a thin film as claimed in claim 2, wherein the member whose surface is made of silicon carbide is a holder for a substrate.

5. A method of producing a thin film as claimed in claim 1, wherein the thin film is produced by a vapor phase growth method.

6. A method of producing a thin film as claimed in claim 1, wherein said deposit comprises silicon.

* * * * *